United States Patent [19]
Manuel

[11] Patent Number: 5,661,485
[45] Date of Patent: Aug. 26, 1997

[54] HOMODYNE RECEIVER APPARATUS AND METHOD

[75] Inventor: Thomas B. Manuel, Santa Cruz, Calif.

[73] Assignee: Condor Systems, Inc., San Jose, Calif.

[21] Appl. No.: 525,300

[22] Filed: Sep. 8, 1995

[51] Int. Cl.$^6$ .................................................... G01S 7/285
[52] U.S. Cl. .............................. 342/13; 342/21; 342/175; 342/194; 342/100
[58] Field of Search ............................ 342/13, 21, 175, 342/194, 195, 100

[56] References Cited

U.S. PATENT DOCUMENTS

| | | | |
|---|---|---|---|
| 3,805,163 | 4/1974 | Hata et al. | 325/437 |
| 3,939,341 | 2/1976 | Graves | 250/199 |
| 4,641,368 | 2/1987 | Sullivan, Jr. | 455/239 |
| 5,241,566 | 8/1993 | Jackson | 375/62 |
| 5,263,193 | 11/1993 | Lammers et al. | 455/315 |
| 5,303,417 | 4/1994 | Laws | 455/314 |
| 5,391,996 | 2/1995 | Marz | 327/158 |
| 5,402,449 | 3/1995 | Schultes et al. | 375/94 |

OTHER PUBLICATIONS

James Bao–Yen Tsui, *Microwave Receivers and Related Components*, John Wiley and Sons, 1986, p. 59.
Stephen E. Lipsky, *Microwave Passive Direction Finding*, John Wiley and Sons, 1987, pp. 202–203.

*Primary Examiner*—John B. Sotomayor
*Attorney, Agent, or Firm*—J. Michael Johnson

[57] ABSTRACT

An apparatus and method of homodyne reception includes power divider circuitry for providing first and second signals from an input signal. Oscillator circuitry generates first and second oscillator signals. The first signal and second oscillator signal are mixed and the second signal and the second oscillator signal are mixed in first and second modulator circuitry, respectively, to provide first and second mixed signals which are further mixed together in image reject mixer circuitry. Amplifiers are used to amplify one of the signals before it is mixed with an oscillator signal and to amplify one of the mixed signals before it is mixed with the other mixed signal in the image reject mixer circuitry. In each of the mixing steps of the preferred embodiment is a filter which filters out spurs in the signals. Another embodiment of the homodyne receiver of the present invention is a multiple channel homodyne receiver comprising a plurality of RF channels, a common lower sideband conversion channel and a common offset oscillator assembly.

20 Claims, 6 Drawing Sheets

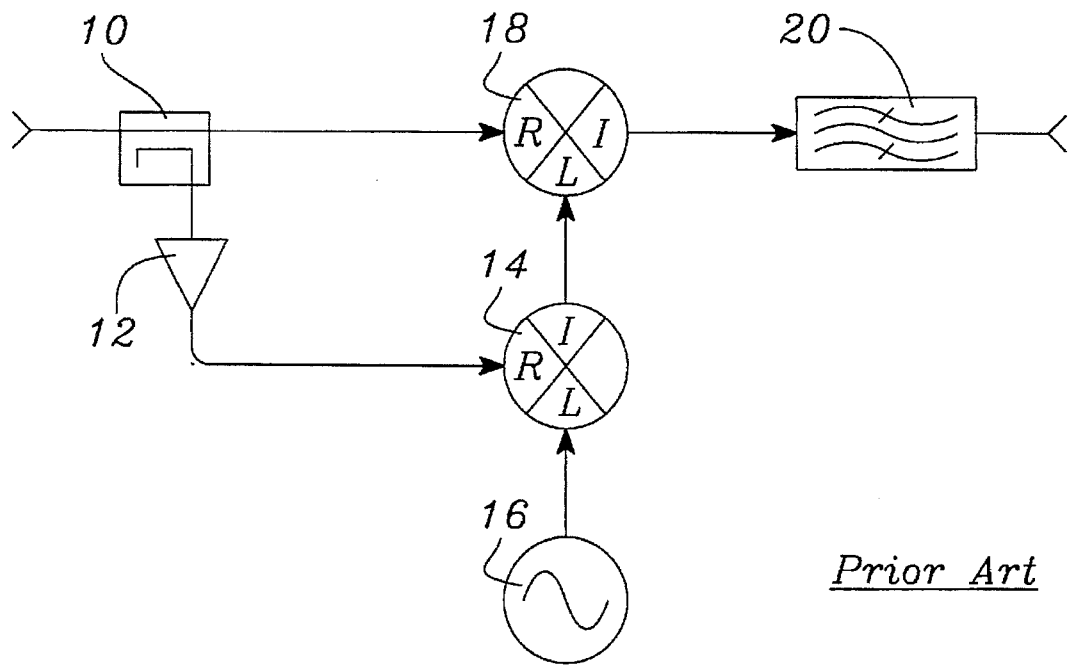
FIG. 1  *Prior Art*
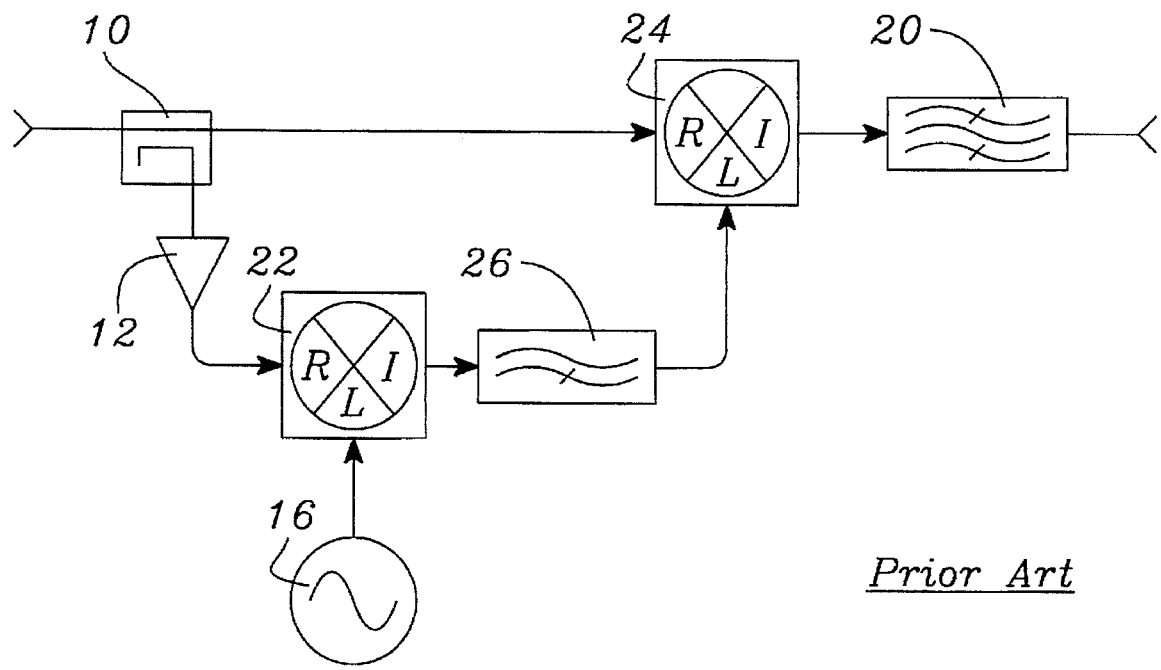
FIG. 2  *Prior Art*

HOMODYNE RECEIVER APPARATUS AND METHOD

BACKGROUND OF THE INVENTION

1. Field of the Invention

The present invention relates to wideband homodyne receivers for use in communications and electronic warfare receiving system applications. In particular, the present invention is a novel homodyne receiver that reduces spurious outputs.

2. Description of the Related Art

Modem communication, radar, and related receiving systems often include a means for converting an input signal at a frequency $f_R$ to another, often lower, frequency $f_I$ to facilitate detection, demodulation and processing of the received signals. A number of receiver architectures have been developed over the last half decade for this purpose including superheterodyne, instantaneous frequency measurement and homodyne receivers. A superheterodyne receiver converts an input signal centered at a frequency $f_R$ to a replica of the input signal centered at a second frequency $f_I$ by mixing the input signal with a variable frequency local oscillator (LO) signal. The frequency $f_I$ is often referred to as the intermediate frequency (IF). Hereinafter, the term mixing refers to the time domain multiplication of a pail of signals in a mixer having a pair of input ports or terminals referred to as the RF and LO ports and a single output port called the IF port.

A homodyne receiver is a specialized superheterodyne receiver in which the local oscillator (LO) is derived from a combination of the input signal and a fixed frequency offset oscillator rather than from an independent variable frequency oscillator. A homodyne receiver converts all input signals within its input bandwidth to a single IF output frequency band without the need for a variable frequency local oscillator. Homodyne receivers are potentially attractive receivers in many applications where the cost associated with a complex, variable frequency local oscillator is prohibitive or where there is some uncertainty about the exact frequency of the input signal.

FIG. 1 illustrates a block diagram of a basic homodyne receiver. The basic homodyne receiver includes a coupler 10, a limiting amplifier 12, a first mixer 14, a fixed frequency offset oscillator 16, a second mixer 18 and an intermediate frequency (IF) bandpass filter 20. A limiting amplifier herein is an amplifier that accepts an input signal with a potentially varying amplitude and produces a constant amplitude signal at the same frequency as the input signal. The offset oscillator 16 produces a single, sinusoid at frequency $f_L$. The RF and LO ports of the mixers 14, 18 are designated R and L respectively and the IF port is designated I. A signal entering the basic homodyne receiver is mixed with a frequency offset version of itself to produce a signal at the desired IF frequency. The IF frequency $f_I$ to which the input signal is thereby converted equals the frequency of the offset oscillator 16, namely $f_L$.

It is well known in the art that an arbitrary input signal can be decomposed into a linear combination of individual frequency or spectral components. The combination of these frequency components is referred to as the spectrum of a signal. The use of an input signal with a single frequency component $f_R$ is not intended to limit the applicability of the discussion that follows.

The operation of the basic homodyne receiver of FIG. 1 can be understood by considering an input signal centered at a frequency $f_R$. A sample of the input signal $f_R$, after being amplified to a constant level by the limiting amplifier 12, is mixed with the output of the offset oscillator 16. The first mixer 14 then generates an output that includes, among other spectral components, a component that is the sum $(\tilde{f}_R+f_L)$ of the frequencies at its RF and LO ports. The signal designated $\tilde{f}_R$ hereinafter refers to the input signal after it has passed through the limiting amplifier 12 to distinguish it from the original input signal $f_R$. Both $f_R$ and $\tilde{f}_R$ are understood to have the same center frequency.

The output of the first mixer containing the spectral component $(\tilde{f}_R+f_L)$ is then mixed with the original input signal $f_R$ in the second mixer 18. The output of the second mixer 18 includes the desired spectral component given by equation (1).

$$(\tilde{f}_R+f_L)-\tilde{f}_R=f_L=f_{I,d} \tag{1}$$

According to equation (1), the output of the homodyne receiver has a component at $f_{I,d}=f_L$ regardless of the input signal frequency $f_R$.

Now consider an input signal centered at $f_R$ with amplitude and/or phase modulation. With this input, the homodyne receiver produces an output signal component centered at $f_L$ and having amplitude and/or phase modulation that is proportional to that of the input signal. Moreover, the IF output center frequency will not change if the center frequency $f_R$ of the input signal changes. The output center frequency $f_I$ is determined by the fixed offset oscillator 16 frequency $f_L$ and not by the input signal center frequency allowing the homodyne receiver to instantaneously track frequency changes in the input signal.

As alluded to above, the desired frequency conversion product $f_{I,d}$ of equation (1) is only one of many products that results from passing an input signal through the homodyne receiver. Real mixers used in receivers generate a large number of spectral components at their outputs in addition to the desired component. The spectral components generated by a real mixer represent linear combinations of the signals present at the LO and RF ports of the mixer and are given by equation (2)

$$f_I=M \cdot f_R+N \cdot f_L \tag{2}$$

where M and N are integers. The spectral components described by equation (2) are known to vary in amplitude relative to the input signal amplitudes. Generally, the amplitudes of the spectral components decrease as the magnitudes of M and/or N increase for real mixers. This decrease means that only the smaller values of M and N are of interest in most designs using mixers. Generally, magnitudes of M and N less than 2 or 3 are the only spurious components with high enough power to be of concern. Since only one pair of {M, N} values represents a desired product in a given mixing application, undesired spectral components will always be present when mixing is employed and must be considered in any application using mixers.

As a minimum, equation (2) indicates that the multiplication of a pair of sinusoids with frequencies $f_R$ and $f_L$, always results in a pair of sinusoids with frequencies $(f_R+f_L)$ and $(f_R-f_L)$ normally referred to as the upper and lower sidebands respectively. The components that represent undesired conversion products and designated hereinafter as $f_{I,s}$ are referred to as spurious responses or simply spurs. The ratio of the spurious output power to the desired component is referred to as the spurious level. The spurious rejection capability of a device is a figure of merit obtained by subtracting the spurious level from one.

Returning now to the case of the first mixer 14 in the homodyne receiver of FIG. 1. The desired signal is ($f_R+f_L$). Other components present at the output of mixer 14 include $f_R$, $f_L$, $2f_R$, $2f_L$, $(f_R-f_L)$, $(2ff_R+f_L)$ as predicted by equation (2). Some of these components can be removed by using a filter between the first mixer 14 and the second mixer 18 but many cannot. Filtering to remove spurious components is especially difficult if the homodyne receiver has a wide input operational frequency range.

In the second mixer 18, the desired component is the lower sideband component represented by the difference between the frequencies at the RF and LO ports. The second mixer 18 will also generate a large number of spurious components. In addition, spurious components from the first mixer 14 are present to add to the number of possible undesired output spurs from the second mixer 18.

FIG. 2 shows an improved homodyne receiver known in the art that overcomes some of the spurious related problems of the simple homodyne receiver of FIG. 1. As with the basic homodyne receiver, the improved homodyne receiver of FIG. 2 has a coupler 10, a limiting amplifier 12, a local oscillator 16, and an IF filter 20. The improved homodyne receiver, however uses an upper sideband single sideband modulator 22 in place of the first mixer 14 and an image reject mixer 24 instead of the second mixer 18. In addition, there is a highpass filter 26 between the single sideband modulator 22 and the image reject mixer 24.

The single sideband (SSB) modulator 22 is a device or circuit, usually including a plurality of mixers, that generates a single sideband, suppressed carrier, modulated output signal from an applied modulating waveform and an un-modulated carrier signal. The SSB modulator has a pair of input ports often referred to as RF or R and LO or L and one or two output ports often called IF ports. Modulator 22 mixes the signal present at the inputs to produce an output signal. The ideal SSB modulator differs from a mixer in that the output signal contains only one of the two sidebands associated with the mixing process. In SSB modulators with two output ports, one generally provides the upper sideband $(f_R+f_L)$ while the other provides the lower sideband $(f_R-f_L)$. SSB modulators with single output ports are internally configured to produce either the upper or lower sideband product and are specified as being either upper sideband SSB modulators or lower sideband SSB modulators.

A block diagram of a single sideband (SSB) modulator known in the art is illustrated in FIG. 3. The SSB modulator of FIG. 3 consists of an input 90-degree hybrid coupler 30 and a pair of mixers 32, 34, an output 180-degree hybrid coupler 36 and a 90-degree hybrid 38. The mixers 32, 34 are preferably double balanced mixers. The desired sideband, either upper sideband or lower sideband, of the modulated carrier can be selected by choosing the proper port 45 or 46 of the 180-degree hybrid 36 and terminating the unused port with a matched load.

In real SSB modulators, suppression of one sideband relative to the other at a given output port of the SSB modulator is not perfect. This is due to non-ideal characteristics of the hybrids and mixers that are used in the circuit. Typical SSB modulators are known in the art to achieve approximately 15 to 20 dB suppression of the unwanted sideband over multi-octave input bandwidths. As with mixers, the output of typical SSB modulators will also contain components at the frequency of the input signals and at other spurious frequencies given by equation (2).

The image reject mixer 24 of the improved homodyne receiver of FIG. 2 is a specialized mixer design that suppresses the mixer's input image response. An image reject mixer generally has a pair of input terminals called RF or R and LO or L and a pair of output terminals. As with the SSB modulator, the image reject mixer 24 is not ideal and only suppresses but does not completely remove the unwanted input sideband.

A block diagram of an image reject mixer known in the art is illustrated in FIG. 4 and has an input port 50, a local oscillator port 51, an upper sideband IF port 52, and a lower sideband port 53. The illustrated image reject mixer includes a pair of 90-degree hybrids 54, 55. A pair of preferably double balanced mixers 56, 57 and a power divider 58. The action of the image reject mixer is to preferentially suppress one of the input sidebands at each of the two output ports 52, 53. Selection of the desired input sideband is accomplished by choosing the appropriate port of the output hybrid 55 and terminating the unused port. The improved homodyne receiver of FIG. 2 requires the image reject mixer 24 to provide the $(f_R-f_L)$ or lower sideband, while the suppressing the $(f_R+f_L)$ or upper sideband.

In the improved homodyne receiver of FIG. 2, the use of the SSB modulator 22 such as the one illustrated in FIG. 3 and the image reject mixer 24 such as that of FIG. 4 lowers the spurious content of the IF output of the improved homodyne receiver of FIG. 2 as compared to that of the basic homodyne receiver of FIG. 1. The output of improved homodyne receiver has three principle spectral components given by equations (3), (4) and (5) below that are of concern to most practical applications of homodyne receivers.

$$(f_R+f_L)-f_R=f_L=f_{I,d} \qquad (3)$$

$$f_R-(f_R-f_L)=f_L=f_{I,s1} \qquad (4)$$

$$(f_R+f_L)-f_R=f_L=f_{I,s2} \qquad (5)$$

Equation (3) represents the desired IF output component while equations (4) and (5) represent spurious responses. The spurious spectral components of equations (4) and (5) are of critical concern because these components are centered at the same frequency, namely $f_I$, as the desired IF component of equation (3).

The frequency component given by equation (4) is the LO image spur created by the mixing of the input signal at $f_R$ with the suppressed lower sideband in the SSB modulator 22. Since the SSB modulator 22 suppresses the lower sideband $(f_R-f_L)$ by about 20 dB, this spurious component will be approximately 20 dB lower than the desired component $f_{I,d}$. The spurious response of equation (5) is the result of the self mixing of the two signals present at the LO port of the image reject mixer 24. Self mixing at the LO port is analogous to and is generated by the same mechanism as the $2f_L$ spur of equation (2) except self-mixing occurs when two signals are present simultaneously at the LO or RF port. Since the SSB modulator 22 does not completely suppress the $f_R$ component present at its input, this component can mix with the $(f_R+f_L)$ component to produce an output at the IF frequency. The $f_R$ component present at the LO port of the image reject mixer 24, unlike the input signal, is constant in amplitude due to the action of the limiting amplifier 12. Likewise, the spurious IF signal centered at $f_{I,s2}$ produced by the mixing product of equation (5) will be constant in amplitude. Even though the $f_R$ component in the output of the SSB modulator 22 is suppressed, the IF spurious component $f_{I,s2}$ could be large compared to desired component $f_{I,d}$ for small input signals.

The spurious components present in the IF signal can cause severe problems in applications where a homodyne receiver is used to generate an IF output signal with phase and amplitude variations or modulations that are proportional to the phase and amplitude variations or modulation of the original input signal. Spurs present in the IF signal will introduce measurement errors when the phase and/or amplitude is measured. The larger the spurious levels are relative to the desired signal level, the larger are the errors that are introduced. The measurement of phase modulation is particularly susceptible to errors caused by the spurious signal components. The phase error introduced by a single spurious component 20 dB below the desired signal component is about 5.5 degrees. In many applications, phase errors of more than a degree or two are considered unacceptable.

Therefore, it would be desirable to have a homodyne receiver that has lower spurious component levels or better spurious rejection characteristics than are possible with conventional homodyne receivers known in the art. Such an improvement in the homodyne receiver would overcome a long standing problem in the area of signal receiver technology.

SUMMARY OF THE INVENTION

The present invention solves the long standing problem in the art of homodyne reception by providing a homodyne method and apparatus that produces an output signal with inherently lower spurious content than is possible with conventional approaches to homodyne reception. The apparatus of the present invention comprises means for providing first and second signals from an input signal and means for generating first and second oscillator signals. The first signal and first oscillator signal are mixed and the second signal and the second oscillator signal are mixed in a plurality of means for mixing signals. The plurality of means for mixing signals provide first and second mixed signals which are further mixed together with another of the plurality of means for mixing. The means for generating first and second oscillator signals can be a plurality of oscillators, each generating an oscillator signal which is subsequently mixed, or an offset oscillator and a power divider for dividing the offset oscillator signal into two oscillator signals.

In a preferred embodiment, a frequency divider with a divisor of two is used with an offset oscillator that has an output frequency yielding an IF center frequency that is one and one-half times the oscillator frequency. The combination of mixing means and means for generating an oscillator signal makes a significant change to the relationships between the IF frequency and the frequencies of the various spurious components. The effect is that the largest spurious components are shifted out of the IF passband so that they can be readily removed by filtering.

The invention further comprises a plurality of means for amplifying signals, wherein one of the means for amplifying amplifies the second signal before entering the mixing means. Another of the means for amplifying amplifies the second mixed signal before being mixed with the first mixed signal.

In the preferred embodiment of the present invention, the plurality of mixing means comprises single sideband modulators to mix the first signal with the first oscillator signal and to mix the second amplified signal with the second oscillator signal, respectively. One of the single sideband modulators is selected for upper sideband and the other for lower sideband modulation. Moreover, the preferred embodiment uses an image reject mixer to mix the first mixed signal and the second amplified mixed signal to produce an output signal of the homodyne receiver. In each of the means for mixing of the preferred embodiment is a filter which filters out spurs in the signals.

In the method of the present invention, an input signal is power divided into two signals and two oscillator signals are generated. One of the divided input signals is amplified and mixed with one of the oscillator signals. The other of the divided input signals and the other of the oscillator signals are mixed together. One of the mixed signals is amplified and mixed with the other mixed signal to produce an output signal of the homodyne receiver. In a preferred embodiment of the method, mixed signals are filtered before being further mixed together and signal which results is filtered again before producing the output signal.

Another embodiment of the homodyne receiver of the present invention is a multiple channel homodyne receiver comprising a plurality Of RF channels, a common lower sideband conversion channel and offset oscillator. The common lower sideband conversion channel and common offset oscillator are shared among the plurality of RF channels.

The performance improvement of the present invention result from significant differences in operation of the homodyne receiver of the present invention compared to the conventional homodyne receivers. Conventional homodyne receivers have limited uses due primarily to their high spurious levels. The present invention significantly improves on this spurious performance thereby greatly broadening the potential application of the homodyne receiver.

BRIEF DESCRIPTION OF THE DRAWINGS

Further details are explained below with the help of the examples illustrated in the attached drawings in which:

FIG. 1 illustrates a block diagram of a basic homodyne receiver.

FIG. 2 illustrates a block diagram of an improved homodyne receiver known in the art.

DETAILED DESCRIPTION OF THE PREFERRED EMBODIMENTS

Figure 5:
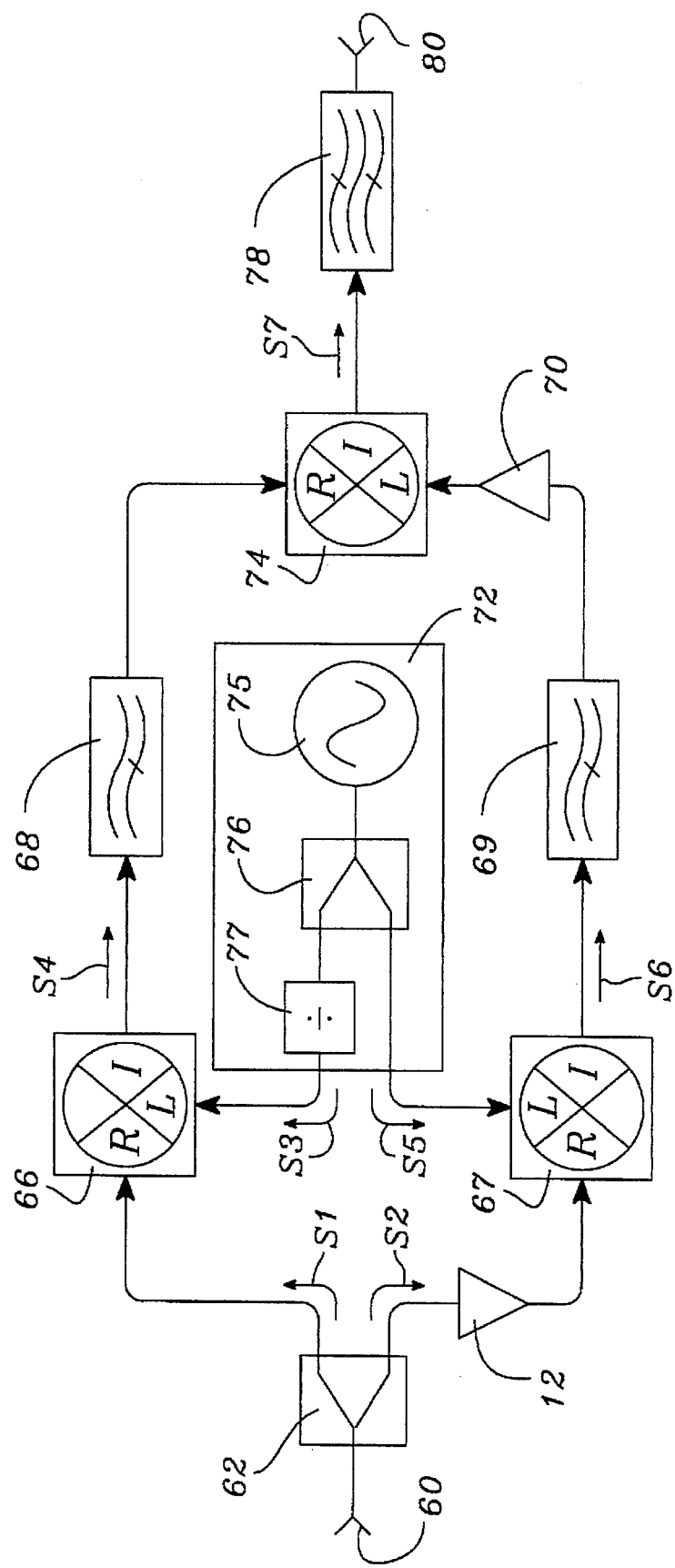
FIG. 5 illustrates a block diagram of the homodyne receiver of the present invention.

The improved homodyne receiver of the present invention is illustrated in FIG. 5. The homodyne receiver of FIG. 5 has an input terminal or port 60 and an output terminal or port 80. A signal applied to the input port 60 is split into two signals S1 and S2 by a first means for power dividing 62. The first power dividing means 62 can be a power divider that produces a pair of equal power output signals from an input signal, a power coupler producing signals S1 and S2 from an input signal that differs in power, or an equivalent device that produces a pair of signals from a single input signal. When an unequal power division coupler is used, the signal S1 is preferably chosen to be the signal with the higher power and signal S2 is the output signal with lower power. The center frequencies and frequencies ranges of signals S1 and S2 are identical.

The signal S1 output by the first power dividing means 62 enters a first means for mixing 66 where it is mixed with an output signal S3 produced by an offset oscillator assembly 72 (described below). The first mixing means 66 has a pair of inputs designated R and L. The R input of the first mixing means 66 preferably has a bandwidth wide enough to accommodate the frequency range of signal S1. The L port of the first mixing preferably has a bandwidth able to accommodate the frequency range of the signal S3. The first mixing means 66 can be a single mixer such as a double balanced mixer, a circuit with a plurality of mixers such as a single sideband modulator, or a similar device for multiplying a pair of input signals having the port bandwidths discussed hereinabove.

A signal S4 generated by mixing signals S1 and S3 exits the first mixing means 66, is filtered by a first highpass filter 68, and is applied a second means for mixing 74. The first highpass filter 68 preferably has a cut-off frequency that is lower than the sum of the lower end of the frequency range of the signal S1 and the frequency of signal 83. The second mixing means 74 has a pair of input ports designated R and L. The R input preferably has a frequency range that accommodates frequencies from the cut-off frequency of the first highpass filter 68 to the frequency equaling the sum of the maximum frequency in the signal S1 frequency range plus the frequency of signal S3. The second mixing means 74 can be a single mixer such as a double balanced mixer, a circuit with several mixers such as an image reject mixer, or a similar device for multiplying a pair of input signals having the port bandwidths discussed hereinabove.

The signal S2 output by the first power dividing means 62 is amplified to a constant power level by a limiting amplifier 12. Signal S2 then enters a third means for mixing 67 where it is mixed with a signal S5 produced by the offset oscillator assembly 72 (described below). The third mixing means 67 has a pair of inputs designated R and L. The R input of the third mixing means 67 preferably has a bandwidth wide enough to accommodate the frequency range of signal S2. The L port of the third mixing 67 means preferably has a bandwidth able to accommodate the frequency range of the signal S5. The third mixing means 67 can be a single mixer such as a double balanced mixer, a circuit with several mixers such as an single sideband modulator, or a similar device for multiplying a pair of input signals having the port bandwidths discussed hereinabove.

Upon exiting the third mixing means 67, the signal S6 is filtered by a second highpass filter 69, amplified by an amplifier 70 and applied the L input of the second mixing means 74. The second highpass filter 69 preferably has a cut-off frequency that is lower than difference between the lower end of the frequency range of signal S2 and the frequency of signal S5. The L input of the second mixing means 74 preferably has a frequency range that accommodates frequencies from the cut-off frequency of the second highpass filter 69 to a frequency equaling the maximum frequency in the signal S2 frequency range minus the frequency of the signal S5. In the second mixing means 74, signals S4 and S6 are mixed to produce signal S7. Signal S7 then exits an output of the second mixing means 74, is filtered by an IF bandpass filter 78 and finally reaches the homodyne receiver output port 80.

The offset oscillator assembly 72 is a means for producing a pair of signals S3 and S5. An embodiment comprises an offset oscillator 75, a power divider 76 and a frequency divider 77. The offset oscillator 75 generates a sinusoidal signal at frequency $f_L$. This signal is power divided into two signals at frequency $f_L$ by the power divider 76. One of the two signals exiting the power divider 76 is the signal referred to hereinabove as signal S5. The signal S5 is subsequently applied to the L input port of the third mixing means 67. The other signal exiting the power divider 76 is applied to an input of the frequency divider 77. The frequency divider 77 then generates an output signal at a frequency $(f_L \div P)$ where the divisor P is an integer. The output signal generated by the frequency divider 77 is the signal referred to hereinabove as signal S3 and is subsequently applied to the L input port of the first mixing means 66. Signals S3 and S5 are interchangeable with respect to the operation of the homo dyne receiver of FIG. 5.

The preferred embodiment of the present invention is discussed in detail hereinafter. In tie preferred embodiment of the present invention, the power dividing means 62 is a powder divider, the first mixing means 66 is a single sideband modulator configured for upper sideband operation, the second mixing means 74 is a lower sideband image reject mixer, and the third mixing means 67 is a single sideband modulator configured for lower sideband operation. Also in the preferred embodiment the frequency divider 77 has a divisor P that equals 2 making the frequency of signal S3 equal to one half the frequency of the offset local oscillator output frequency $f_L$.

Figure 3:
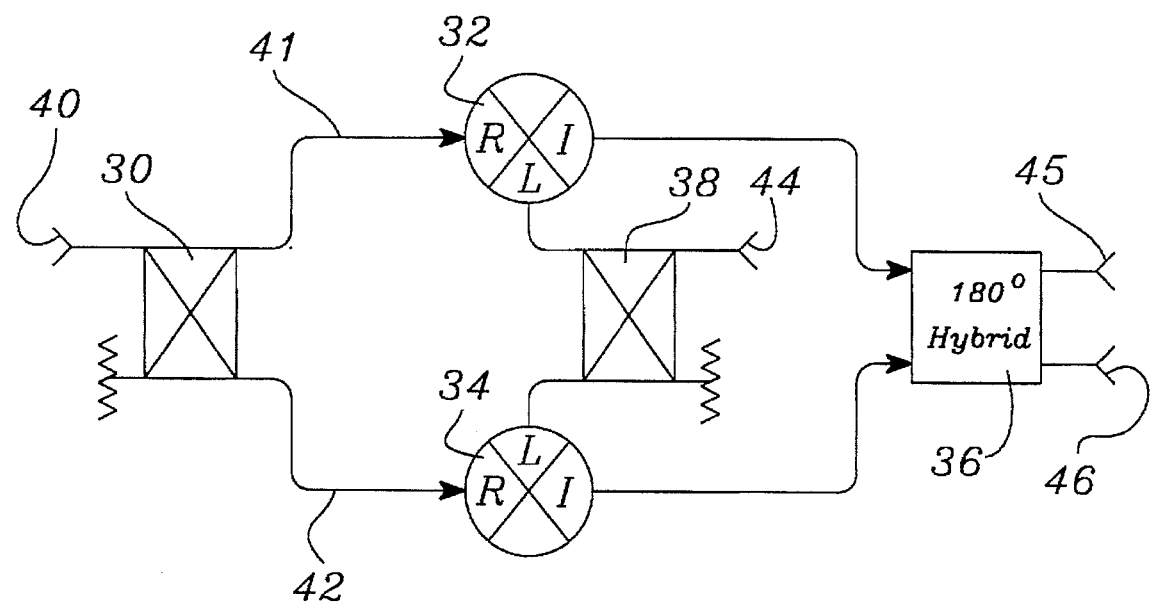
FIG. 3 illustrates a block diagram of a single sideband modulator.
Figure 4:
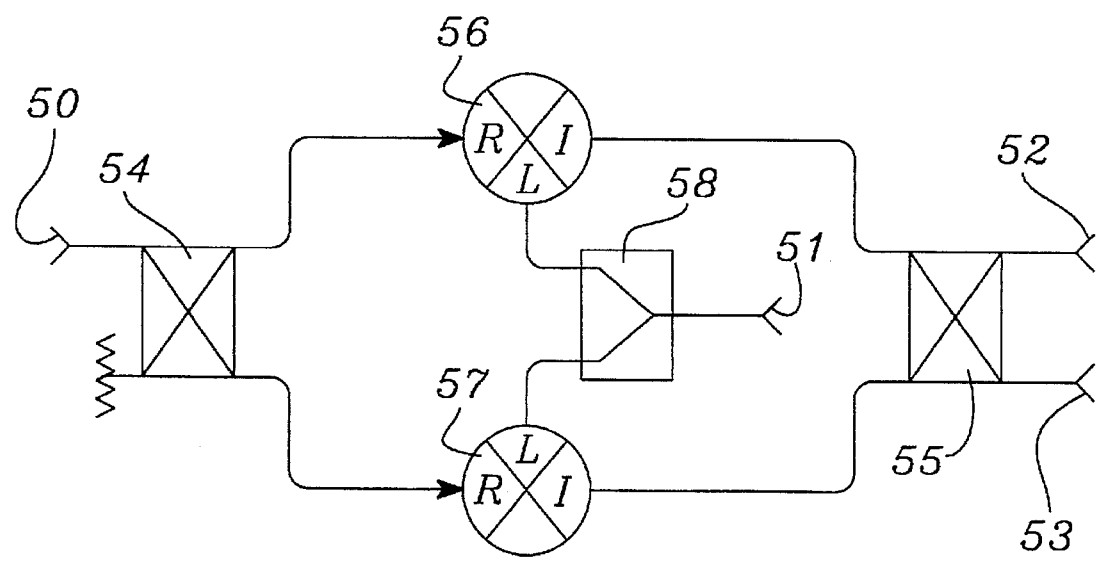
FIG. 4 illustrates a block diagram of an image rejection mixer.

As discussed hereinabove, a typical SSB modulator such as that illustrated in FIG. 3 has two output ports. One of these output ports produces an output signal in which the level of the upper sideband of the modulation product is suppressed relative to the level of the lower sideband. This port is called the lower sideband port. The other output port suppresses the lower sideband modulation product and is called the upper sideband port. An SSB modulator is configured for lower sideband operation by terminating the upper sideband output port with an appropriate load and designating the upper sideband port as an output port. A SSB modulator is configured for upper sideband operation by terminating the lower sideband port and using the upper sideband port as an output port. SSB modulators can be purchased or manufactured with both ports available so a single unit can fulfill both the requirements of the upper SSB modulator 66 and the lower SSB modulator 67. Alternately, pre-terminated SSB modulators specifically designed for upper sideband or lower sideband operation can be utilized.

The operation of the preferred embodiment of the homodyne receiver of the present invention can be understood by considering an input signal with a center frequency $f_R$ applied to the input port 60 and the offset oscillator 75 with a frequency of $\eta_L$. In addition, the frequency divider 77 divides the frequency of a signal applied to its input by (P=2). The four principle frequency components of signal S7 at the output of the image reject mixer 74 for the present invention are given by equations (6), (7),(8) and (9) below.

$$\left(f_R + \frac{f_L}{2}\right) - (f_R - f_L) = \frac{3}{2} f_L = f_{I,d} \tag{6}$$

$$\left(f_R + \frac{f_L}{2}\right) - f_R = \frac{1}{2} f_L = f_{I,s1} \tag{7}$$

$$f_R - (f_R - f_L) = f_L = f_{I,s2} \tag{8}$$

$$\left(f_R - \frac{f_L}{2}\right) - (f_R - f_L) = \frac{1}{2} f_L = f_{I,s3} \qquad (9)$$

The frequency components represented by Equations (6) through (9) are the principle components in that they are the highest power level components with frequencies in the vicinity of the IF center frequency. Equation (6) represents the desired IF frequency product. Equations (7), (8), and (9) represent the highest level spurious products. All of the spurious components are separated from the IF frequency at $\frac{3}{2} f_L$ so that the IF bandpass filter 78 can easily separate and remove the spurious components from the desired If output. A similar situation exists for the self-mixing terms discussed hereinabove. In fact, the lowest order spur (i.e. the spur with the smallest values of M and/or N from equation (2)) that occurs in the IF passband is in the suppressed image of the image reject mixer 74 and is represented by equation (10).

$$(f_R + f_L) - \left(f_R - \frac{f_L}{2}\right) = \frac{3}{2} f_L = f_{I,s4} \qquad (10)$$

The $f_{I,s4}$ component is the combination of two, already suppressed components and is further suppressed by the action of the image reject mixer 74 since it represent one of the image responses of the image reject mixer 74. In practice, the $f_{I,s4}$ spur is usually observed to be suppressed more than 36 dB below the desired response centered at $f_{I,d}$.

Figure 6A:
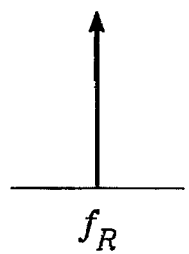
FIGS. 6a–6d illustrate the principle spectral components of signals illustrated in FIG. 5 in a frequency vs. amplitude format.
Figure 6B:
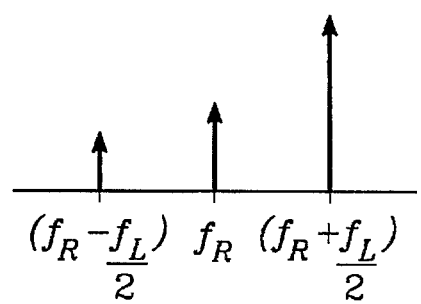
Figure 6C:
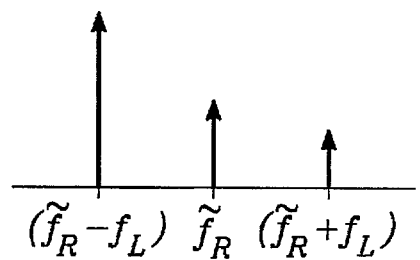
Figure 6D:
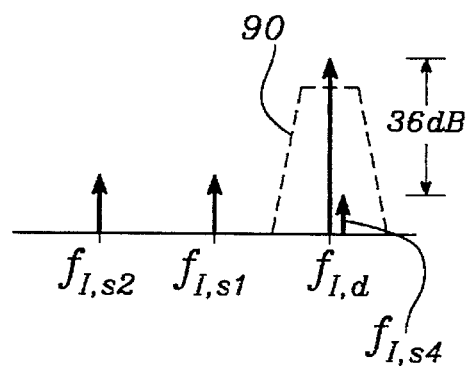

Consider an input signal consisting of a single sinusoid at frequency $f_R$ applied to input 60 and having a signal spectrum illustrated in FIG. 6a. The resulting signal spectrums for the signals S4, S6, and S7 of the preferred embodiment are illustrated in FIGS. 6b through 6d respectively. Since the power divider 62 of the preferred embodiment does not affect the relationship of the frequency components of a signal passing through it, FIG. 6a is equivalently the spectrum of signals S1 and S2 for the example input signal.

The spectrum of signal S4 is illustrated in FIG. 6b showing the upper, $$\left(f_R + \frac{f_L}{2}\right)$$

and lower sideband $$\left(f_R - \frac{f_L}{2}\right)$$

products produced by the mixing of signals S1 and S3 in the upper sideband single sideband modulator 66. The relative suppression of the lower sideband product $$\left(f_R - \frac{f_L}{2}\right)$$

compared to the upper sideband product $$\left(f_R + \frac{f_L}{2}\right)$$

is indicated qualitatively in FIG. 6b by the relative differences in the heights of these two spectral components. FIG. 6b also illustrates leakage of the $f_R$ component of signal S1 into signal S4.

FIG. 6c illustrates the major spectral components present in signal S6. Signal S6 is the product of mixing signals S2 and S5 in the lower sideband single sideband modulator 67.

The lower sideband product ($f_R - f_L$) is larger than either the upper sideband product ($f_R + f_L$) or the leakage component $f_R$.

The spectrum illustrated in FIG. 6d is that of signal S7 and includes the desired component $f_{I,d}$ of equation (6) and the four spurious products of equations (7), (8), (9), and (10). The spurious components $f_{I,s2}$ and $f_{I,s3}$ have the same frequency and lie on top of each other in FIG. 6c. For clarity, only the $f_{I,s2}$ is illustrated in FIG. 6c. The passband of a typical IF bandpass filter 78 is sketched as a dashed line 90 in FIG. 6d. The amount of attenuation afforded by the IF bandpass filter 78 at spurious frequencies $f_{I,s1}$, $f_{I,s2}$, $f_{I,s3}$, $f_{I,s4}$ is dependent on the application but usually need be no more than approximately 40 dB. As illustrated in FIG. 6d, the suppression of $f_{I,s4}$ relative to $f_{I,d}$ is on the order of 36 dB for the preferred embodiment.

By way of further example, consider an input signal such as that illustrated in FIG. 6a at frequency $f_R$=4.0 GHz applied to the homodyne receiver of the preferred embodiment in which the offset oscillator had a frequency $f_L$=200 MHz. The output products in the spectrum of signal S7 would be at $f_{I,d}$=300 MHz, $f_{I,s1}$=100 MHz, $f_{I,s2}$=200 MHz, fhd I,s3=100 MHz. The only significant in-band spurious product is $f_{I,s4}$=300 MHz. As discussed hereinabove, this product is suppressed on the order of 36 dB relative to the desired product $f_{I,d}$.

The homodyne receiver of FIG. 5 has a dramatic affect on the performance and spurious content of the IF signal observed at the output port 80 when compared to the conventional homodyne receivers known in the art. Spurious levels up to 20 dB lower than those of the conventional homodyne receivers are realized by the preferred embodiment of the present invention.

The performance improvement of the present invention result from significant differences in operation of the homodyne receiver of the present invention compared to the conventional homodyne receivers of FIGS. 1 and 2. For example, the IF center frequency equals the offset oscillator 16 frequency $f_L$ in the conventional receivers. In the preferred embodiment of the present invention, the IF center frequency $f_L$ is one and one-half times the frequency of the offset oscillator 75 frequency. Also, the preferred embodiment of the homodyne receiver of the present invention has none of its direct, first order conversion spurious products at the same frequency as the desired IF frequency output.

Figure 7:
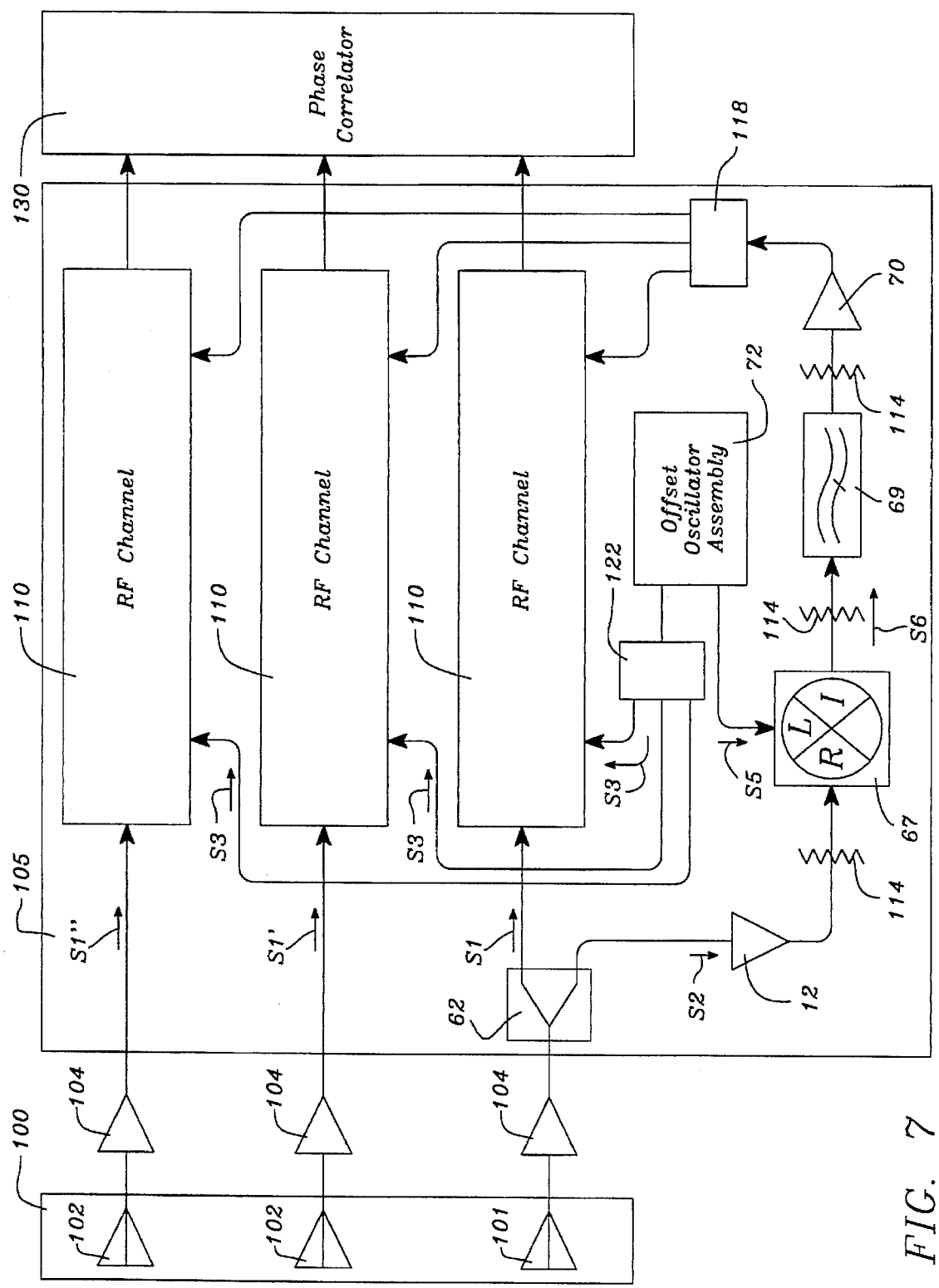
FIG. 7 illustrates a three channel version of the homodyne receiver of the present invention and its application to a phase interferometer system for measuring the angle arrival of a received signal.
Figure 8:
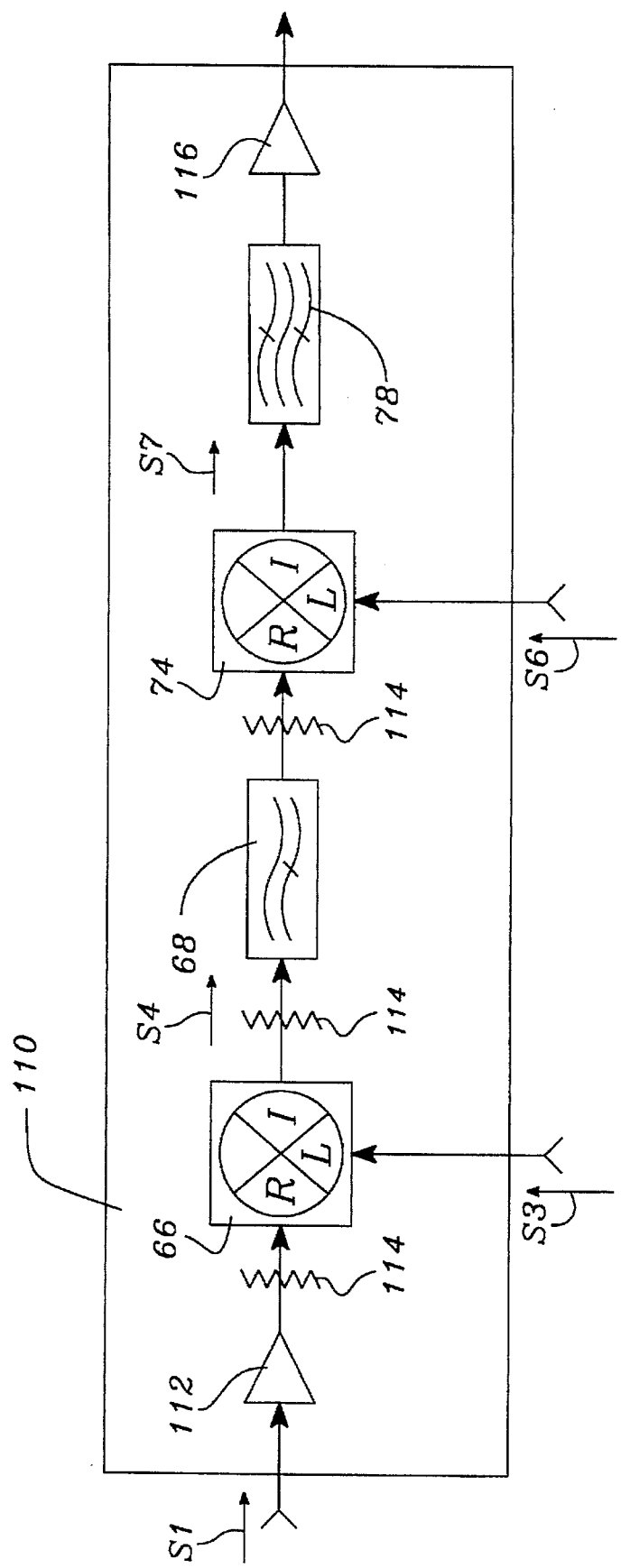
FIG. 8 illustrates an RF conversion channel of the three channel homodyne receiver of FIG. 7.

Another embodiment of the homodyne receiver of the present invention is a multiple channel homodyne receiver 105 illustrated in FIG. 7. The multiple channel homodyne receiver comprises a plurality of RF channels 110 that share a common offset oscillator 72 and a common lower sideband conversion channel. The RF channel 110 is illustrated in FIG. 8. The RF channels each comprise a upper sideband single sideband modulator 66, a highpass filter 68, an image reject mixer 74 and an IF bandpass filter 78 similar to FIG. 5 and further comprises amplifiers 112, 116 and RF attenuators 114 as illustrated in FIG. 8. The common lower sideband conversion channel illustrated in FIG. 7 comprises the limiting amplifier 12, the lower sideband single sideband modulator 67, the second highpass filter 69 and the amplifier 70 of FIG. 5. The lower sideband conversion channel mixes the signal S5 generated by the offset oscillator 72 with the signal S2 to produce signal S6 that is subsequently used as an L port input signal for the image reject mixers 74 of the RF channels 110.

A phase interferometer using the multiple channel homodyne receiver 105 is further illustrated in FIG. 7. A phase interferometer determines the angle of arrival of a signal by measuring the difference in the signal phase as received by a plurality of physically separated antennas. The example of a phase interferometer illustrated in FIG. 7 consists of an antenna assembly 100, the multi-channel homodyne receiver 105, and a phase correlator 130. The phase interferometer antenna assembly 100 comprises a reference antenna 101 and at least one measurement antenna 102. One reference antenna 101 and two measurement antennas 102 are included in the illustrated example of FIG. 7. The phase difference between the signal as received by antenna 101 and the measurement antenna(s) 102 is indicative of the angle of arrival of a received signal. A separate RF channel 110 is connected to each of the antennas 101, 102 to convert the received signal to an IF signal which is then applied to a phase correlator 130. The RF channel 110 attached to the reference antenna is called a reference channel while the RF channel(s) 110 connected to the measurement antennas 102 are referred to as measurement channels. The phase differences measured by the phase correlator 130 are differences between the phase of signals in the measurement channels and the reference channel.

For the three channel homodyne receiver 105 illustrated in FIG. 7, a three-way power divider 122 is used to distribute the offset oscillator signal S3 from oscillator 72 to the upper sideband single sideband modulators 66 of the RF channels 110. Similarly, a three-way power divider 118 is used to distribute the amplified signal S6 to the image reject mixers 74 in each of the RF channels 110. The reference RF channel 110 whose received signal is designated S1 has a power divider 62 between its input port and the antenna assembly 100. The power divider 62 routes a portion of the received signal to the common lower sideband channel as was the case for the single channel homodyne receiver of FIG. 5. The other RF channels 110 receive signals S1' and S1" directly from the antenna assembly 100 without an intervening power divider. The signals S1, S1', and S1" all result from the reception of a signal incident on the antenna assembly. The amplitude and phase of signals S1, S1", and S1" may differ from each other but their frequency content is the same.

Low noise RF amplifiers 104 are used between the antenna assembly 100 and the three channel homodyne receiver 105 to provide high sensitivity and enable the reception of low level signals. Amplifiers 112 are low noise amplifiers and are included in the RF channels 110 to provide some additional signal amplification. In practice, low value RF attenuators or pads 114 in the range of approximately 1.0–6.0 dB may be used in-between components that are sensitive to input/output impedance mismatch. Examples of components that are often sensitive to mismatch are the single sideband modulator 66 and image reject mixer 74. The question of whether to use pads 114, where to use them, and what values to use are determined empirically by one skilled in the art without undue experimentation and depends on the specific choice of the components of the receiver 105. The same can be said for the determination of the exact gain of the amplifiers 104, 112, and 70.

Since the phase interferometer system illustrated in FIG. 7 measures phase differences between the reference channel and the measurement channels, IF limiting amplifiers 116 are included in the RF channels 110. These IF limiting amplifiers 116 would not be included if amplitude measurements of the received signal are to be performed. For the phase interferometer system, the IF limiting amplifiers 116 remove a source of phase measurement error due to amplitude fluctuations of the signals in the RF channels and amplitude modulation on the signals. The beneficial characteristics of low spurious content of the signals S7 exiting the homodyne receiver 105 RF channels 110 aids significantly in keeping the phase errors within acceptable limits when signal phases are compared in the phase correlator 130. Without the homodyne receiver 105 of the present invention, the phase interferometer of FIG. 7 would be impractical.

A prototype of the multi-channel homodyne receiver 105 having three RF channels 110 as illustrated in FIG. 7 was constructed and tested. The prototype was intended to receive signals in the 6.0–18.0 GHz frequency range with modulation bandwidths of less than 25.0 MHz. The offset oscillator output frequency was selected to be 106.67 MHz making the IF center frequency 160 MHz. The input power divider 62 used in the prototype was a model DM8285 manufactured by TRM of Manchester, N.H. The limiting amplifier 12 was a model MSDA-4618 manufactured by Menlo Industries of Fremont, Calif. The RF channels 110, part number SYS0218B17E, were manufactured by Miteq of Hauppage, N.Y. The lower sideband single sideband modulator 67 in the prototype was purchased as an integrated assembly from Miteq of Hauppage, N.Y. as part number SM0218LC1C. The highpass filters 69 having a 2.0–18.0 GHz passband was model F-11367 manufactured by RLC of Mt. Kisco, N.Y. The amplifier 70 was a model 618–605 manufactured by JCA of Newbury Park, Calif. and provided 24.0 dB linear gain to boost the level of the signals entering the LO port of the image reject mixer 74 to a level sufficient for proper operation. The IF bandpass filter 78 had a center frequency of 160.0 MHz and a passband of 25.0 MHz. The offset oscillator assembly 72 was model 500–04536A manufactured by Wenzel of Austin, Tex. which provided a pair of output signals S3 and S5. The signal S3 was centered at 106.7 MHz and the signal S5 was one half the frequency of the signal S3. The three way power divider 122 was a model number DL-444 manufactured by TRM of Manchester, N.H. The prototype was tested and results consistent with the discussion hereinabove were obtained. In particular, the highest level spur in the IF passband observed was less than 36.0 dB below the desired frequency component for input signal levels greater than −65.0 dBm. This spurious level translates into a measurement phase error on the order of 1.0 degree.

The improved homodyne receiver of the present invention advantageously reduces the spurious content of the receiver's output signal compared to the spurious content of the conventional homodyne receivers. The key features of the present invention that facilitate lower spurious production include the use of three mixing means 66, 67, 74, instead of two, and the introduction of the two offset oscillator signals S3 and S5. These features have the advantageous effect of shifting the location of the worst spurs out of the IF passband. Reducing the spurious content of the IF signal at the output port of the present invention reduces the amplitude and phase errors introduced by these spurs in the IF output signal.

The presence of high level spurs resulting in phase errors on the order of 5.5 degrees in the IF output signal of conventional homodyne receivers has limited the application of these conventional homodyne receivers. Modern receiving system used for phase measurement typically require phase errors lower than about 2.0 degrees. Conventional homodyne receivers are not often used in modem communication, radar, and related receiving systems simply because they have unacceptably high phase and amplitude errors due to the IF spurs.

The significant reduction of the IF spurious content of the homodyne receiver of the present invention makes the use of homodyne receivers much more attractive for the modern receiving systems. The prototype homodyne receiver of the preferred embodiment described hereinabove exhibits in-band spurious levels consistent with phase errors of less than 1.0 degree. Phase errors of 1.0 degree are well within the phase error requirements of many modern receiving systems.

Thus there has been disclosed a new, improved homodyne receiver apparatus and method that functions to receive signals while producing significantly lower spurious components and, consequently, introduces significantly lower phase and amplitude errors than is possible with conventional homodyne receivers. Changes and modifications may be made to the invention which may be readily apparent to those skilled in the art without going beyond the intended scope of the invention, as defined by the appended claims.

What is claimed is:

1. A homodyne receiver for receiving an input signal and producing an output signal comprising:

means for providing a first signal and a second signal from the input signal;

means for generating a first oscillator signal and a second oscillator signal a plurality of means for mixing signals that mix the first signal with the first oscillator signal to produce a first mixed signal, mix the second signal with the second oscillator signal to produce a second mixed signal, and mix said first mixed signal and said second mixed signal to produce the output signal; and a plurality of means for amplifying signals, wherein one of the means for amplifying signal amplifies the second signal before the second signal is mixed with second oscillator signal and wherein another means for amplifying signals amplifies the second mixed signal before the second mixed signal is mixed with the first mixed signal.

2. The homodyne receiver of claim 1, wherein the means for generating a first oscillator signal and a second oscillator signal comprises a first oscillator and a second oscillator, respectively.

3. The homodyne receiver of claim 1, wherein the means for generating a first oscillator signal and a second oscillator signal comprises:

an offset oscillator for generating an offset oscillator signal; and a power divider for dividing the offset oscillator signal into a first oscillator signal and a second oscillator signal.

4. The homodyne receiver of claim 3, wherein the means for generating a first oscillator signal and a second oscillator signal further comprises:

a frequency divider for dividing the frequency of one of the first or the second oscillator signal.

5. The homodyne receiver of claim 1, wherein the means for providing a first signal and a second signal from the input signal comprises means for dividing the input signal into the first signal and the second signal each having a power lower than a power of the input signal.

6. The homodyne receiver of claim 1, wherein the means for amplifying the second signal before the second signal is mixed with the second oscillator signal is a limiting amplifier.

7. The homodyne receiver of claim 1, wherein the plurality of means for mixing signals comprises:

first means for mixing signals that mixes the first signal with the first oscillator signal to produce the first mixed signal;

second means for mixing signals that mixes the second signal with the second oscillator signal to produce the second mixed signal; and third means for mixing that mixes the first mixed signal with the second mixed signal adjacent the output of the receiver.

8. The homodyne receiver of claim 7, wherein said first means for mixing signals and the second means for mixing signals comprise:

a single sideband modulator for mixing signals; and a highpass filter for filtering the mixed signals.

9. The homodyne receiver of claim 7, wherein said third means for mixing signals comprises:

an image reject mixer for mixing the first mixed signal and the second mixed signal to produce a mixed signal product; and a bandpass filter for filtering the mixed signal product to provide the output signal of the homodyne receiver.

10. The homodyne receiver of claim 8, wherein the single sideband modulator of one of the first or second means for mixing signals is a lower sideband single sideband modulator and the other of the first or second means for mixing signals is an upper sideband single sideband modulator.

11. A multi-channel homodyne receiver for receiving a plurality of input signals and producing a plurality of output signals comprising:

means for providing a first signal and a second signal from one of the plurality of input signals;

means for generating a plurality of oscillator signals;

a plurality of RF channels, each for receiving another of the plurality of input signals, one of the plurality of RF channels for receiving the first signal from the means for providing, each of the RF channels receiving separate ones of the plurality of oscillator signals;

a common lower sideband conversion channel for receiving the second signal and another of the plurality of oscillator signals, wherein the common lower sideband conversion channel comprises:

means for mixing the second signal with the received oscillator signal and producing a second mixed signal, a power divider with a plurality of output ports for dividing the second mixed signal into a plurality of divided second mixed signals, and a plurality of means for amplifying signals, wherein one of the plurality of means for amplifying signals amplifies the second signal before the second signal is received by the means for mixing, and wherein another of the plurality of means for amplifying signals amplifies the second mixed signal before the second mixed signal is received by the power divider;

and wherein each of the plurality of RF channels comprises:

means for mixing respective ones of the input signals with respective ones of the oscillator signals to produce respective ones of a first mixed signal;

means for mixing the first mixed signals with separate ones of the divided second mixed signals to produce the plurality of output signals.

12. A method of homodyne reception, wherein an input signal having a range of frequencies is received and an output signal is generated, comprising the steps of:

power dividing the input signal into a first signal and a second signal;

generating a first oscillator signal and a second oscillator signal;

mixing said first signal with the first oscillator signal and mixing said second signal with the second oscillator signal such that a first mixed signal and a second mixed signal are generated, respectively;

mixing said first mixed signal with said second mixed signal to generate the output signal;

amplifying said first signal before the step of mixing said first signal; and amplifying said second mixed signal before the step of mixing the first mixed signal and the second mixed signal.

13. The method of claim 12, wherein the step of generating a first oscillator signal and a second oscillator signal comprises the steps of:

generating an offset oscillator signal; and power dividing the offset oscillator signal into the first oscillator signal and the second oscillator signal.

14. The method of claim 13, wherein the step of generating a first oscillator signal and a second oscillator signal further comprises the step of:

frequency dividing one of the first or the second oscillator signals before the steps of mixing by an integer.

15. The method of claim 14, wherein in the step of frequency dividing, one of the first or the second oscillator signals is divided by an integer equal to 2.

16. The method of claim 12, wherein the step of mixing the first signal with the first oscillator signal and mixing the second signal with the second oscillator signal, comprises the steps of:

creating a first mixed signal containing an upper sideband and a lower sideband;

creating a second mixed signal containing an upper sideband and a lower sideband; and selecting the upper sideband of the first mixed signal and the lower sideband of the second mixed signal.

17. The method of claim 16, wherein the step of mixing the first signal with the first oscillator signal and mixing the second signal with the second oscillator signal, further comprises the step of:

filtering each of the first mixed signal and the second mixed signal with a highpass filter.

18. The method of claim 16, wherein the step of mixing the first mixed signal with the second mixed signal comprises the steps of:

mixing the upper sideband of the first mixed signal with the lower sideband of the second mixed signal; and generating a frequency domain difference signal as the output signal.

19. The method of claim 18, wherein the step of mixing the first mixed signal with the second mixed signal further comprises the step of:

filtering the frequency domain difference signal with a bandpass filter.

20. The method of claim 12, wherein the step of amplifying the first signal comprises the step of amplifying the first signal with a limiting amplifier.

* * * * *